(12) United States Patent
Liu et al.

(10) Patent No.: US 10,312,271 B2
(45) Date of Patent: Jun. 4, 2019

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Zheng Liu, Beijing (CN); Xiaolong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/759,498

(22) PCT Filed: Aug. 7, 2017

(86) PCT No.: PCT/CN2017/096204
§ 371 (c)(1),
(2) Date: Mar. 12, 2018

(87) PCT Pub. No.: WO2018/054180
PCT Pub. Date: Mar. 29, 2018

(65) Prior Publication Data
US 2019/0131325 A1    May 2, 2019

(30) Foreign Application Priority Data

Sep. 23, 2016   (CN) .......................... 2016 1 0847629

(51) Int. Cl.
*H01L 27/12* (2006.01)
*H01L 29/66* (2006.01)
*H01L 29/786* (2006.01)

(52) U.S. Cl.
CPC ...... *H01L 27/1281* (2013.01); *H01L 27/1262* (2013.01); *H01L 27/1296* (2013.01);
(Continued)

(58) Field of Classification Search
CPC .................. H01L 21/02675–02686; H01L 27/1214–1296; H01L 29/66742–6678; H01L 29/786–78696; H01L 2021/775
See application file for complete search history.

(56) References Cited

U.S. PATENT DOCUMENTS

| 7,123,314 B2 | 10/2006 | Matsunaga et al. |
| 2005/0007512 A1 | 1/2005 | Matsunaga et al. |

(Continued)

FOREIGN PATENT DOCUMENTS

| CN | 101493613 A | 7/2009 |
| CN | 103268047 A | 8/2013 |

(Continued)

OTHER PUBLICATIONS

International Search Report issued in International Patent Application No. PCT/CN2017/096204, dated Nov. 3, 2017; with English translation.

(Continued)

*Primary Examiner* — Daniel P Shook
(74) *Attorney, Agent, or Firm* — McDermott Will & Emery LLP

(57) ABSTRACT

An array substrate, a manufacturing method thereof and a display device. The array substrate includes a substrate, a thin film transistor on the substrate, and including an active layer including a source region, a drain region and a channel region between the source region and the drain region; a heat dissipation layer disposed between the substrate and the drain region; and the orthographic projection of the heat dissipation layer on the substrate at least covers the orthographic projection of a part of the source region and a part of the drain region on the substrate. The manufacturing (Continued)

method is for the manufacturing of the array substrate. The array substrate can improve the sizes and uniformity of the crystal particles.

20 Claims, 8 Drawing Sheets

(52) U.S. Cl.
CPC .. *H01L 29/66757* (2013.01); *H01L 29/78633* (2013.01); *H01L 29/78675* (2013.01)

(56) References Cited

U.S. PATENT DOCUMENTS

2016/0343747 A1* 11/2016 Du .................. G02F 1/1362
2019/0057986 A1*  2/2019 Wang .............. H01L 27/1274

FOREIGN PATENT DOCUMENTS

| CN | 104157700 A | 11/2014 |
| CN | 204204858 U | 3/2015 |
| CN | 104538400 A | 4/2015 |
| CN | 105140294 A | 12/2015 |
| CN | 106206622 A | 12/2016 |

OTHER PUBLICATIONS

Written Opinion of the International Searching Agency issued in International Patent Application No. PCT/CN2017/096204, dated Nov. 3, 2017; with English translation.
Chinese First Office Action issued in Chinese Patent Application No. 2016108476299, dated Jul. 30, 2018; with English translation.

* cited by examiner

ARRAY SUBSTRATE, MANUFACTURING METHOD THEREOF AND DISPLAY DEVICE This application is the U.S. National Phase under 35 U.S.C. § 371 of International Patent Application No. PCT/CN2017/096204, filed on Aug. 7, 2017, which in turn claims the benefit of China Patent Application No. 201610847629.9 filed on Sep. 23, 2016, the entire contents of which are hereby incorporated by reference as part of this application.

TECHNICAL FIELD

The present disclosure relates to an array substrate, a manufacturing method thereof, and a display device.

BACKGROUND

A Low Temperature Poly-Silicon-Thin Film Transistor (LTPS-TFT) display have the advantages of high resolution, fast response, high brightness, high aperture ratio and high electron mobility.

Currently, a low-temperature poly-silicon thin film transistor includes an active layer, a gate insulating layer, a gate electrode, a source electrode and a drain electrode which are disposed on a substrate. The active layer includes a source region, a drain region, and a channel region between the source region and the drain region. In order to avoid the channel region of the active layer being irradiated with light to generate leakage current and the electrical performance of the poly-silicon thin film transistor being affected, a metal light-shielding layer needs to be provided at a position corresponding to the channel region.

The active layer is obtained by performing an ion implantation process on a poly-silicon layer. The poly-silicon layer is generally formed by means of: forming an amorphous silicon thin film on a substrate, then converting the amorphous silicon thin film into a poly-silicon thin film by an excimer laser annealing method, and then the poly-silicon thin film is patterned by a patterning process to form a poly-silicon layer having a specific pattern. Alternatively, an amorphous silicon thin film may be formed on a substrate firstly, and a specific pattern is formed through a patterning process, then the amorphous silicon is converted into the poly-silicon by an excimer laser annealing method to form a poly-silicon layer.

However, due to the existence of the metal light-shielding layer, the heat dissipation rates of the source region and the drain region are quite slower than the heat dissipation rate of the channel region. When the excimer laser annealing converts the amorphous silicon into the poly-silicon, the channel region has crystallized, but the temperature of the source region and the drain region has not reached the crystallization temperature yet, resulting in smaller sizes of the crystal particles, poor uniformity of the crystal particles and poor crystal quality, and thus limiting the improvement of the electrical performance of the thin film transistor device.

SUMMARY

The embodiments of the present disclosure provide an array substrate, a manufacturing method thereof, and a display device, which can improve the sizes and uniformity of the crystal particles.

At least one embodiment of the present disclosure provides an array substrate, which includes: a substrate; a thin film transistor disposed on the substrate, and including an active layer including a source region, a drain region and a channel region between the source region and the drain region; a heat dissipation layer between the substrate and the active layer; and the orthographic projection of the heat dissipation layer on the substrate at least covers the orthographic projection of a part of the source region and a part of the drain region on the substrate, the heat dissipation layer is configured to make a heat dissipation rate of the source region and the drain region larger than the heat dissipation rate of the channel region.

In some examples, the orthogonal projection of the heat dissipation layer on the substrate completely covers the orthogonal projection of the channel region.

In some examples, the heat dissipation layer is a metal light-shielding layer.

In some examples, the orthographic projection of the heat dissipation layer on the substrate completely covers the orthographic projection of the active layer on the substrate.

In some examples, the heat dissipation layer includes a first portion corresponding to the channel region, a second portion corresponding to the source region, and a third portion corresponding to the drain region; the size of the second portion beyond the source region is greater than the size of the first portion beyond the channel region, and the size of the third portion beyond the drain region is greater than the size of the first portion beyond the channel region, along the direction perpendicular to the length of the channel region.

In some examples, the second portion extends beyond the source region and the third portion extends beyond the drain region along the direction of the length of the channel region.

In some examples, the orthographic projection of the first portion on the substrate is larger than the orthographic projection of the channel region on the substrate, the orthographic projection of the second portion on the substrate is larger than the orthographic projection of the source region on the substrate, and the orthographic projection of the third portion on the substrate is larger than the orthographic projection of the drain region on the substrate.

In some examples, the heat dissipation layer includes a first portion corresponding to the channel region, a second portion corresponding to the source region, and a third portion corresponding to the drain region; and the area of the second portion beyond the source region is greater than the area of the first portion beyond the channel region; the area of the third portion beyond the drain region is greater than the area of the first portion beyond the channel region.

In some examples, the heat dissipation layer includes a first portion corresponding to the channel region, a second portion corresponding to the source region, and a third portion corresponding to the drain region; and areas of the second portion and the third portion are both greater than the area of the first portion.

In some examples, a thermal conductivity of the heat dissipation layer is greater than 85 W/(m·K).

In some examples, a thickness of the heat dissipation layer is 40~200 nm.

In some examples, the array substrate further includes a buffer layer disposed between the heat dissipation layer and the active layer.

At least one embodiment of the present disclosure provides a display device, including the array substrate according to any one of the above.

At least one embodiment of the present disclosure provides a manufacturing method of an array substrate, which includes: forming a heat dissipation layer on a substrate; forming an amorphous silicon layer on the heat dissipation layer; processing the amorphous silicon layer to form an active layer comprising a source region, a drain region, and a channel region between the source region and the drain region, wherein the orthographic projection of the heat dissipation layer on the substrate at least covers the orthographic projection of a part of the source region and a part of the drain region on the substrate, the heat dissipation layer is configured to make a heat dissipation rate of the source region and the drain region larger than the heat dissipation rate of the channel region.

In some examples, processing the amorphous silicon layer to form an active layer comprising a source region, a drain region, and a channel region between the source region and the drain region, including: annealing the amorphous silicon layer to form a poly-silicon layer; patterning the poly-silicon layer to form the active layer, and the active layer includes the source region, the drain region, and the channel region between the source region and the drain region.

In some examples, the heat dissipation layer is a metal light-shielding layer.

In some examples, the orthographic projection of the heat dissipation layer on the substrate completely covers the orthographic projection of the active layer on the substrate.

In some examples, the heat dissipation layer includes a first portion corresponding to the channel region, a second portion corresponding to the source region, and a third portion corresponding to the drain region; the size of the second portion beyond the source region is greater than that of the first portion beyond the channel region, and the size of the third portion extends beyond the drain region is greater than that of the first portion beyond the channel region, along the direction perpendicular to the length of the channel region.

In some examples, the manufacturing method further includes: forming a gate insulating layer and a gate electrode on the active layer sequentially; using the gate electrode as a mask, and performing ion-implanting on the active layer that is not blocked by the gate electrode; and forming an interlayer insulating layer, a source electrode and a drain electrode, and the source electrode and the drain electrode are in contact with the active layer.

In some examples, the manufacturing method further includes: forming a buffer layer on the heat dissipation layer before forming the amorphous silicon layer.

BRIEF DESCRIPTION OF THE DRAWINGS

In order to describe technical solutions in the embodiments of the present disclosure more clearly, the drawings of the embodiments will be introduced briefly. Obviously, the accompanying drawings in the following description relate to only some embodiments of the present disclosure rather than limiting to the present disclosure.

FIG. 9(a) is a top schematic view of forming a heat dissipation layer, a buffer layer and a poly-silicon layer on a substrate according to embodiments of the present disclosure;

DETAILED DESCRIPTION

In order to make the objectives, the technical solutions, and the advantages of the embodiments of the present disclosure more clear, the technical solutions of the embodiments of the present disclosure will be described clearly and completely with reference to the drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
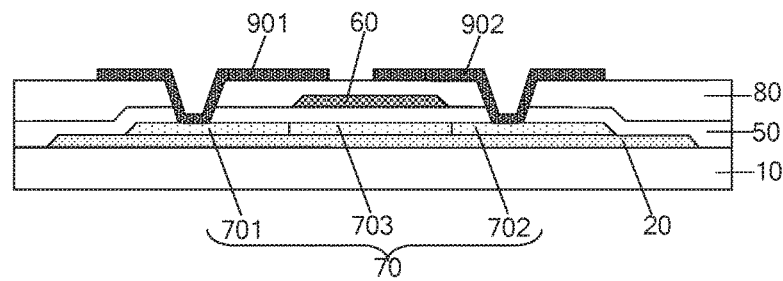
FIG. 1 is a schematic structure diagram I of an array substrate according to embodiments of the present disclosure.
Figure 2:
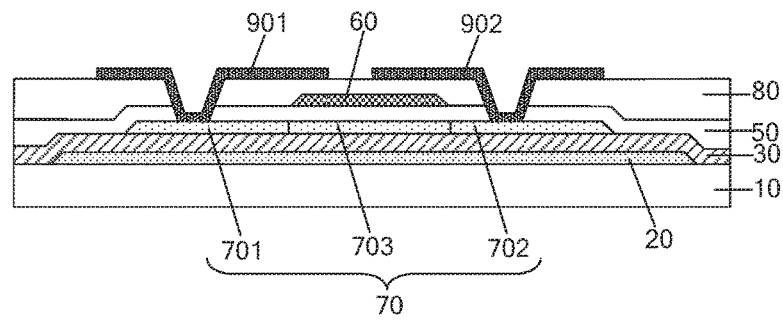
FIG. 2 is a schematic structure diagram II of an array substrate according to embodiments of the present disclosure.

As shown in FIG. 1 and FIG. 2, the embodiments of the present disclosure provide an array substrate, which includes a substrate 10 and a thin film transistor disposed on the substrate 10. The thin film transistor includes an active layer 70. The active layer 70 includes a source region 701, a drain region 702, and a channel region 703 between the source region 701 and the drain region 702. The array substrate further includes a heat dissipation layer 20 disposed between the substrate 10 and the active layer 70. The orthographic projection of the heat dissipation layer 20 on the substrate 10 at least covers the orthographic projection of a part of the source region 701 and a part of the drain region 702 on the substrate 10. The heat dissipation layer is configured to make a heat dissipation rate of the source region and the drain region larger than the heat dissipation rate of the channel region.

In some examples, the thin film transistor may be a poly-silicon thin film transistor.

For example, the thin film transistor further includes a gate insulating layer 50, a gate electrode 60, an interlayer insulating layer 80, a source electrode 901 and a drain electrode 902 which are located above the active layer 70. The source electrode 901 and the drain electrode 902 are respectively contacted with the source region 701 and the drain region 702 of the active layer 70.

In some examples, the orthogonal projection of the heat dissipation layer 20 on the substrate completely covers the orthogonal projection of the channel region 703 on the substrate 10.

In some examples, the heat dissipation layer 20 may be a metal light-shielding layer. When the heat dissipation layer 20 is the metal light-shielding layer, the orthographic projection of the heat dissipation layer 20 on the substrate 10 completely covers the orthographic projection of the channel region 703 on the substrate 10.

For example, the orthographic projection of the heat dissipation layer 20 on the substrate 10 completely covers that of the channel region 703 on the substrate 10, and the metal light-shielding layer 20 at least covers the orthographic projection of a part of the source region 701 and a part of the drain region 702 on the substrate 10.

For example, as shown in FIG. 3(a) and FIG. 3(b), the orthographic projection of the heat dissipation layer 20 on the substrate 10 may completely cover the orthographic projection of the active layer 70 on the substrate 10. That is, the orthographic projection of the active layer 70 on the substrate 10 is completely located in the orthogonal projection of the heat dissipation layer 20 on the substrate 10. For example, the area of the portion of the heat dissipation layer 20 corresponding to the source region 701 may be greater than or equal to the area of the source region 701, and the area of the portion of the heat dissipation layer 20 corresponding to the drain region 702 may be greater than or equal to the area of the drain region 702.

For example, the area of each portion may refer to the area of the orthogonal projection of each portion on the substrate 10.

Figure 3:
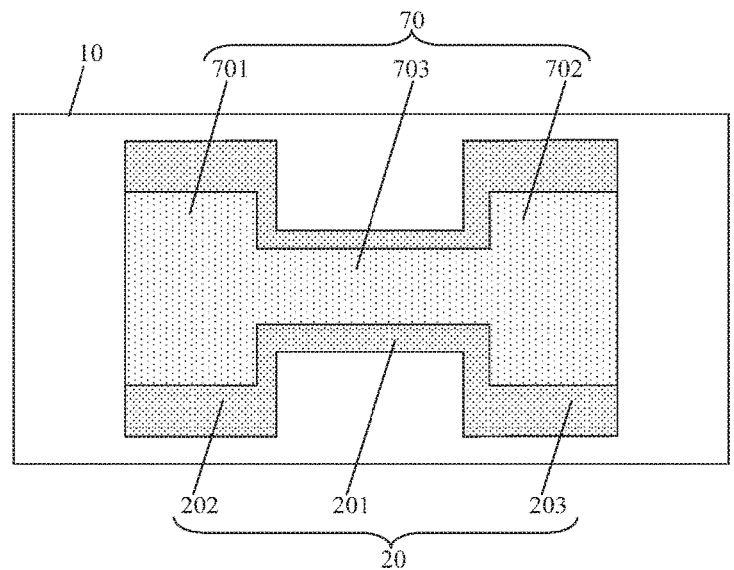
FIG. 3(a) is a top schematic view I of forming a heat dissipation layer and an active layer on a substrate according to embodiments of the present disclosure.
FIG. 3(b) is a top schematic view II of forming a heat dissipation layer and an active layer on a substrate according to embodiments of the present disclosure.
FIG. 3(c) is a top schematic view III of forming a heat dissipation layer and an active layer on a substrate according to embodiments of the present disclosure.
Figure 3:
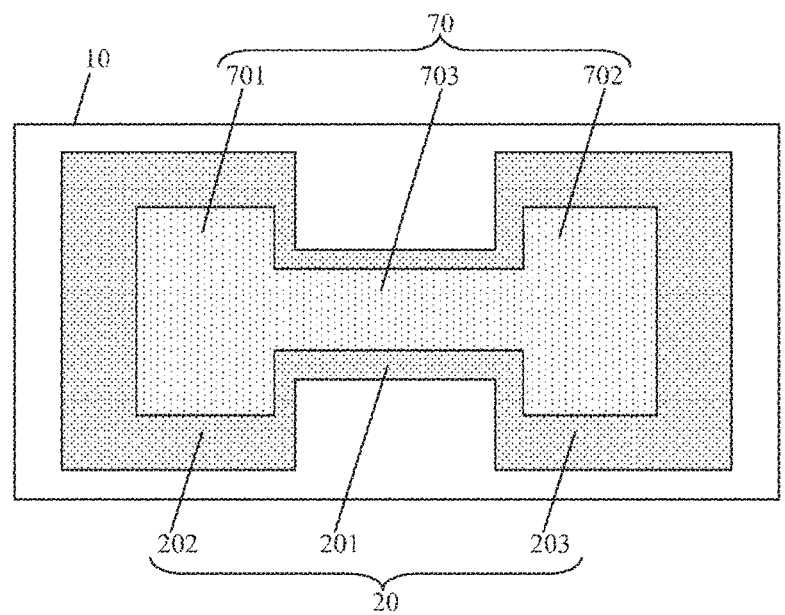
Figure 3:
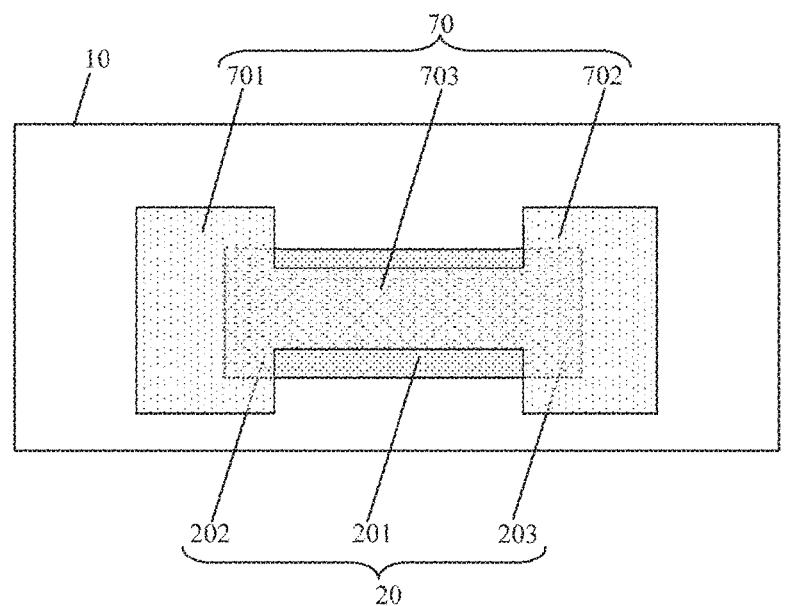

As shown in FIG. 3 (c), the orthogonal projection of the heat dissipation layer 20 on the substrate 10 partially covers the orthographic projection of the source region 701 and the drain region 702 of the active layer 70 on the substrate 10. For example, the area of the portion of the heat dissipation layer 20 corresponding to the source region 701 may be smaller than the area of the source region 701, and the area of the portion of the heat dissipation layer 20 corresponding to the drain region 702 may be smaller than the area of the drain region 702.

The sizes of the portions of the heat dissipation layer 20 corresponding to the source region 701 and corresponding to the drain region 702 are not limited as long as the heat dissipation rate of the source region 701 and the drain region 702 is increased, so that when the channel region 703 is crystallized, the temperature of the source region 701 and the drain region 702 also reaches the crystallization temperature. On the basis of this, in order to increase the size of the crystal particles, the channel region 703 may have a different heat dissipation rate from the source region 701 and the drain region 702, by the means of properly setting the sizes of the portions of the heat dissipation layer 20 corresponding to the source region 701 and corresponding to the drain region 702.

For example, the material of the heat dissipation layer 20 is not particularly limited in the embodiments of the present disclosure as long as it can dissipate heat.

According to the material of the heat dissipation layer 20, if it does not affect the active layer 70, the heat dissipation layer 20 may directly contact with the active layer 70 as shown in FIG. 1; if it does, a buffer layer 30 may be provided between the heat dissipation layer 20 and the active layer 70 as shown in FIG. 2. For example, the buffer layer 30 is an insulating layer.

The embodiments of the present disclosure provide an array substrate. The heat dissipation rates of the source region 701 and the drain region 702 are increased by providing the heat dissipation layer 20 between the active layer 70 and the substrate 10. When using the excimer laser annealing to make the amorphous silicon convert into poly-silicon, the temperature of the source region 701 and the drain region 702 may also reach to the crystallization temperature. On basis of this, since the channel region 703 has a different heat dissipation rate from the source region 701 and the drain region 702, in the process of the formation of the crystal particles, the crystal nuclei can grow along the direction of low heat dissipation rate to form long crystal particles growing in the same direction, so that the sizes of the crystal particles can be increased relative to the prior art. As the growth direction of the crystal nuclei is the same, thus the uniformity of the crystal particles is improved, and thus the quality of the crystal is improved to some extent, making the electrical properties of thin-film transistors improved.

The embodiments of the present disclosure provide an array substrate. Comparing with the heat dissipation layer 20 only being disposed in the channel region 703, the heat dissipation rates of the source region 701 and the drain region 702 are increased by providing the heat dissipation layer 20 between the active layer 70 and the substrate 10 and making the heat dissipation layer 20 extend from the channel region 703 of the active layer 70 toward the source region 701 and the drain region 702. When using the excimer laser annealing to make the amorphous silicon convert into poly-silicon, the temperature of the source region 701 and the drain region 702 may also reach to the crystallization temperature. On basis of this, since the channel region 703 has a different heat dissipation rate from the source region 701 and the drain region 702, in the process of the formation of the crystal particles, the crystal nuclei can grow along the direction of low heat dissipation rate to form long crystal particles growing in the same direction, so that the sizes of the crystal particles can be increased relative to the prior art. As the growth direction of the crystal nuclei is the same, thus the uniformity of the crystal particles is improved, and thus the quality of the crystal is improved to some extent, making the electrical properties of thin-film transistors improved.

In some examples, as shown in FIG. 3(a) and FIG. 3(b), the orthographic projection of the heat dissipation layer 20 on the substrate 10 completely covers the orthographic projection of the active layer 70 on the substrate 10. The heat dissipation layer 20 includes a first portion 201 corresponding to the channel region 703, a second portion 202 corresponding to the source region 701, and a third portion 203 corresponding to the drain region 702. The size of the second portion 202 beyond the source region 701 is greater than the size of the first portion 201 beyond the channel region 703, and the size of the third portion 203 beyond the drain region 702 is greater than the size of the first portion 201 beyond the channel region 703, along the direction perpendicular to the length of the channel region 703.

It should be noted that, the size of the second portion 202 beyond the source region 701 is the portion of the second portion 202 which does not correspond to the source region 701. The area of the orthographic projection of the second portion 202 on the substrate 10 is equal to the area of the orthographic projection of the source region 701 on the substrate 10 plus the area of the orthographic projection of the portion of the second portion 202 beyond the source region 701 on the substrate 10.

Similarly, the size of the third portion 203 beyond the drain region 702 is the portion of the third portion 203 which does not correspond to the drain region 702. The size of the first portion 201 beyond the channel region 703 is the portion of the first portion 201 which does not correspond to the channel region 703.

For example, the heat dissipation layer extends beyond these regions on both sides of the source region, the drain region, and the channel region along the direction perpendicular to the length of the channel region 703, and then the above exceeded size may refer to the sum of the exceeded size of the both sides.

The embodiments of the present disclosure can ensure that the temperature of the source region 701 and the drain region 702 also reaches the crystallization temperature when the channel region 703 is crystallized, by means of making the sizes of the second portion 202 and the third portion 203 of the heat dissipation layer 20 beyond the source region 701 and the drain region 702 respectively along the direction perpendicular to the length of the channel region 703 are greater than the size of the first portion 201 beyond the channel region 703.

In some examples, the second portion 202 extends beyond the source region 701 and the third portion 203 extends beyond the drain region 702 along the direction of the length of the channel region 703, as shown in FIG. 3(b).

Namely, the heat dissipation layer 20 is shaped like an H shape.

In some examples, the orthographic projection of the first portion 201 on the substrate 10 is larger than the orthographic projection of the channel region 703 on the substrate 10, the orthographic projection of the second portion 202 on the substrate 10 is larger than the orthographic projection of the source region 701 on the substrate 10, and the orthographic projection of the third portion 203 on the substrate 10 is larger than the orthographic projection of the drain region 702 on the substrate 10.

For example, the orthographic projection of the first portion 201 on the substrate 10 may include a first overlap region and a first non-overlapping region. The first overlap region is corresponding to the orthographic projection of the channel region 703 on the substrate 10, and the first non-overlapping region is a region of the orthographic projection of the first portion 201 on the substrate 10 other than the first overlap region.

Similarly, the orthographic projection of the second portion 202 on the substrate 10 may include a second overlap region and a second non-overlapping region. The second overlap region is corresponding to the orthographic projection of the source region 701 on the substrate 10, and the second non-overlapping region is a region of the orthographic projection of the second portion 202 on the substrate 10 other than the second overlap region. The orthographic projection of the third portion 203 on the substrate 10 may include a third overlap region and a third non-overlapping region. The third overlap region is corresponding to the orthographic projection of the drain region 702 on the substrate 10, and the third non-overlapping region is a region of the orthographic projection of the third portion 203 on the substrate 10 other than the third overlap region.

It should be noted that, areas of the second non-overlapping region and the third non-overlapping region are both greater than the area of the first non-overlapping region.

In the embodiments of the present disclosure, by making the second portion 202 and the third portion 203 respectively extend along the direction of the length of the channel region 703 to exceed the source region 701 and the drain region 702, it is able to further increase the heat dissipation rates of the source region 701 and the drain region 702 and make the heat dissipation rates of the source region 701 and the drain region 702 greater than that of the channel region 703. Thus the crystal nuclei will grow toward the channel region 703 along the direction from the source region 701 and the drain region 702, and form more uniform long crystal particles growing along the direction of the length of the channel region 703, such that the crystal particles of the channel region 703 have a greater size, better uniformity and higher crystal quality.

In some examples, the orthographic projection of the metallic light-shielding layer 20 on the substrate 10 completely covers the orthographic projection of the active layer 70 on the substrate 10. The heat dissipation layer 20 includes a first portion 201 corresponding to the channel region 703, a second portion 202 corresponding to the source region 701, and a third portion 203 corresponding to the drain region 702. The area of second portion 202 beyond the source region 701 is greater than the area of the first portion 201 beyond the channel region 703. The area of the third portion 203 beyond the drain region 702 is greater than the area of the first portion 201 beyond the channel region 703.

In the embodiments of the present disclosure, by making the area of the second portion 202 beyond the source region 701 greater than the area of the first portion 201 beyond the channel region 703 and the area of the third portion 203 beyond the drain region 702 greater than the area of the first portion 201 beyond the channel region 703, it is able to further increase the heat dissipation rates of the source region 701 and the drain region 702 and make the heat dissipation rates of the source region 701 and the drain region 702 greater than the heat dissipation rate of the channel region 703. Thus the crystal nuclei will grow along the direction from the source region 701 and the drain region 702 toward the channel region 703, and form more uniform long crystal particles growing along the direction of the length of the channel region 703, such that the crystal particles of the channel region 703 have a greater size, better uniformity and higher crystal quality.

In some examples, the orthographic projection of the heat dissipation layer 20 on the substrate 10 completely covers the orthographic projection of the active layer 70 on the substrate 10. The heat dissipation layer 20 includes a first portion 201 corresponding to the channel region 703, a second portion 202 corresponding to the polar region 701, and a third portion 203 corresponding to the drain region 702. The areas of the second portion 202 and the third portion 203 are both greater than the area of the first portion 201.

In other examples, the orthographic projections of the source region and the drain region of the active layer 70 on the substrate 10 are only partially covered by the orthographic projection of the heat dissipation layer 20 on the substrate 10. The heat dissipation layer 20 includes a first portion 201 corresponding to the channel region 703, a second portion 202 corresponding to the source region 701, and a third portion 203 corresponding to the drain region 702. The areas of the second portion 202 and the third portion 203 are both greater than the area of the first portion 201.

In this way, it is ensured that the heat dissipation rates of the source region 701 and the drain region 702 are greater than the heat dissipation rate of the channel region 703. Thus the crystal nuclei will grow along the direction from the source region 701 and the drain region 702 toward the channel region 703, and form more uniform long crystal particles growing along the direction of the length of the channel region 703, such that the crystal particles of the channel region 703 have a greater size, better uniformity and higher crystal quality.

For example, a thermal conductivity of the heat dissipation layer 20 is greater than 85 W/(m·K).

For example, the heat dissipation layer 20 may be made of metal, metal alloy, or the like, for example, the heat dissipation layer 20 may be made of opaque metal material such as molybdenum, aluminum, molybdenum, tungsten, etc.

In this way, it is ensured that the thermal conductivity of the heat dissipation layer 20 is greater than the thermal conductivity of the other layers in contact with the active layer 70. It is thus ensured that during the conversion of the amorphous silicon into the poly-silicon, the heat dissipations of the source region 701 and the drain region 702 are mainly achieved by the heat dissipation layer 20, such that the heat dissipation rates of the source region 701 and the drain region 702 are different from the heat dissipation rate of the channel region 703.

For example, a thickness of the heat dissipation layer 20 is 40~200 nm.

On one hand, if the heat dissipation layer 20 is too thin, it is unable to achieve the shielding effect. On the other hand, if the heat dissipation layer 20 is too thick, it will increase the process time and increase the cost, and the excessively thick film may cause unevenness on the surface of the film and affect the following process.

For example, the array substrate further includes a buffer layer 30 disposed between the heat dissipation layer 20 and the active layer 70 as shown in FIG. 2.

The buffer layer 30 may be a one-layer structure. The material of the buffer layer 30 may be silicon oxide, silicon nitride, etc. The buffer layer 30 may also have two or more layers.

In the embodiments of the present disclosure, it is able to prevent metal ion impurities of the substrate 10 and the heat dissipation layer 20 from diffusing into the active layer 70 and affecting the electrical characteristics of the TFT by providing the buffer layer 30 between the heat dissipation layer 20 and the active layer 70.

For example, the thickness of the buffer layer 30 is 50~600 nm.

On one hand, if the buffer layer 30 is too thin, it is unable to achieve the effect of blocking the diffusion of metal ion impurities. On the other hand, if the buffer layer 30 is too thick, it will increase the process time and increase the cost, and the excessively thick film will increase the stress of the film to make the structure easily broken.

Figure 4:
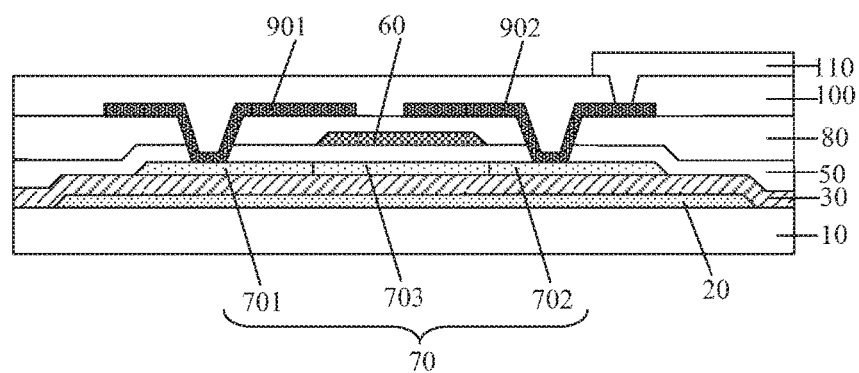
FIG. 4 is a schematic structure diagram III of an array substrate according to embodiments of the present disclosure.
Figure 5:
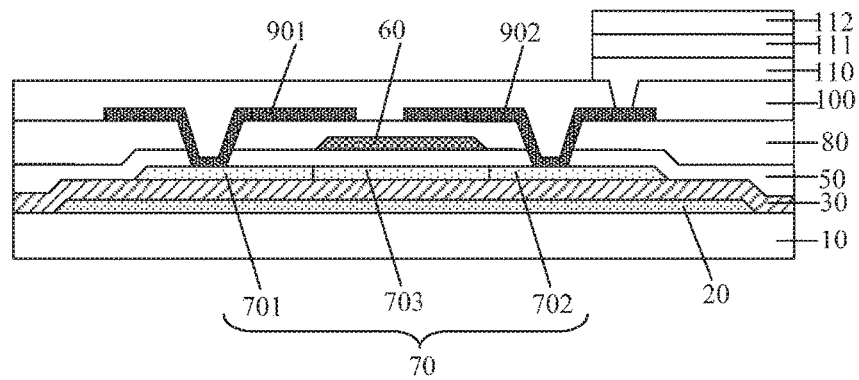
FIG. 5 is a schematic structure diagram IV of an array substrate according to embodiments of the present disclosure.

For example, as shown in FIG. 4 and FIG. 5, the array substrate further includes a first electrode 110 electrically connected to the drain electrode 902 of the poly-silicon thin film transistor. The first electrode 110 is a pixel electrode or an anode.

If the first electrode 110 is an anode, the array substrate is an OLED (Organic Light-Emitting Diode) array substrate, and the array substrate further includes an organic material functional layer 111 and a cathode 112.

If the first electrode 110 is a pixel electrode, the array substrate is an LCD (liquid crystal display) array substrate, and the array substrate may further include a common electrode.

The embodiments of the present disclosure further provide a display device, which includes the above-mentioned array substrate.

The display device may be a liquid crystal display device or an OLED display device. For example, the display device may be any product or component having any display function such as a display panel, a monitor, a television, a digital photo frame, a cell phone, a tablet, and the like.

The embodiments of the present disclosure further provide a manufacturing method of an array substrate. As shown in FIG. 1 and FIG. 2, the manufacturing method includes forming a thin film transistor on the substrate 10. For example, the thin film transistor may be a poly-silicon thin film transistor. The poly-silicon thin film transistor includes the active layer 70. The active layer 70 includes the source region 701, the drain region 702, and the channel region 703 between the source region 701 and the drain region 702. The active layer 70 is obtained by performing ion-implanting on a poly-silicon layer. The poly-silicon layer 402 is obtained by performing an excimer laser annealing on the amorphous silicon layer. And the method further includes: forming the heat dissipation layer 20 corresponding to the active layer 70 on the substrate 10 before forming the poly-silicon thin film transistor. The orthographic projection of the heat dissipation layer 20 on the substrate 10 covers at least the orthographic projection of a part of the source region 701 and a part of the drain region 702 on the substrate 10. The heat dissipation layer is configured to make heat dissipation rates of the source region and the drain region larger than a heat dissipation rate of the channel region.

The embodiments of the present disclosure provide a manufacturing method of an array substrate. The heat dissipation rates of the source region 701 and the drain region 702 are increased by providing the heat dissipation layer 20 between the active layer 70 and the substrate 10. When using the excimer laser annealing to make the amorphous silicon convert into poly-silicon, the temperature of the source region 701 and the drain region 702 may also reach to the crystallization temperature. On basis of this, since the channel region 703 has a different heat dissipation rate from the source region 701 and the drain region 702, in the process of the formation of the crystal particles, the crystal nuclei can grow along the direction of low heat dissipation rate to form long crystal particles growing in the same direction, so that the sizes of the crystal particles can be increased relative to the prior art. As the growth direction of the crystal nuclei is the same, thus the uniformity of the crystal particles is improved, and thus the quality of the crystal is improved to some extent, making the electrical properties of thin-film transistors improved.

The embodiments of the present disclosure provide a manufacturing method of an array substrate. Comparing with the heat dissipation layer 20 only being disposed in the channel region 703, the heat dissipation rates of the source region 701 and the drain region 702 are increased by providing the heat dissipation layer 20 between the active layer 70 and the substrate 10 and making the heat dissipation layer 20 extend from the channel region 703 of the active layer 70 toward the source region 701 and the drain region 702. When using the excimer laser annealing to make the amorphous silicon convert into poly-silicon, the temperature of the source region 701 and the drain region 702 may also reach to the crystallization temperature. On basis of this, since the channel region 703 has a different heat dissipation rate from the source region 701 and the drain region 702, in the process of the formation of the crystal particles, the crystal nuclei can grow along the direction of low heat dissipation rate to form long crystal particles growing in the same direction, so that the sizes of the crystal particles can be increased relative to the prior art. As the growth direction of the crystal nuclei is the same, thus the uniformity of the crystal particles is improved, and thus the quality of the crystal is improved to some extent, making the electrical properties of thin-film transistors improved.

For example, as shown in FIG. 3 (a) and FIG. 3 (b), the orthographic projection of the heat dissipation layer 20 on the substrate 10 completely covers that of the active layer 70 on the substrate 10. The heat dissipation layer 20 include the first portion 201 corresponding to the channel region 703, the second portion 202 corresponding to the source region 701, and the third portion 203 corresponding to the drain region 702. The size of the second portion 202 beyond the source region 701 is greater than the size of the first portion 201 beyond the channel region 703, and the size of the third portion 203 beyond the drain region 702 is greater than the size of the first portion 201 beyond the channel region 703, along the direction perpendicular to the length of the channel region 703.

The embodiments of the present disclosure can ensure that the temperature of the source region 701 and the drain region 702 also reaches the crystallization temperature when the channel region 703 is crystallized, by means of making the sizes of the second portion 202 and the third portion 203 of the heat dissipation layer 20 beyond the source region 701 and the drain region 702 respectively along the direction perpendicular to the length of the channel region 703 are greater than the size of the first portion 201 beyond the channel region 703.

For example, the second portion 202 extends beyond the source region 701 and the third portion 203 extends beyond the drain region 702 along the direction of the length of the channel region 703, as shown in FIG. 3(b).

Namely, the heat dissipation layer 20 is shaped like an H shape.

In the embodiments of the present disclosure, by making the second portion 202 and the third portion 203 respectively extend along the direction of the length of the channel region 703 to exceed the source region 701 and the drain region 702, it is able to further increase the heat dissipation rates of the source region 701 and the drain region 702 and make the heat dissipation rates of the source region 701 and the drain region 702 greater than the heat dissipation rate of the channel region 703. Thus the crystal nuclei will grow along the direction from the source region 701 and the drain region 702 toward the channel region 703, and form more uniform long crystal particles growing along the direction of the length of the channel region 703, such that the crystal particles of the channel region 703 have a greater size, better uniformity and higher crystal quality.

For example, the orthographic projection of the metallic light-shielding layer 20 on the substrate 10 completely covers the orthographic projection of the active layer 70 on the substrate 10. The heat dissipation layer 20 includes a first portion 201 corresponding to the channel region 703, a second portion 202 corresponding to the source region 701, and a third portion 203 corresponding to the drain region 702. The area of second portion 202 beyond the source region 701 is greater than the area of the first portion 201 beyond the channel region 703. The area of the third portion 203 beyond the drain region 702 is greater than the area of the first portion 201 beyond the channel region 703.

In the embodiments of the present disclosure, by making the area of the second portion 202 beyond the source region 701 is greater than the area of the first portion 201 beyond the channel region 703 and the area of the third portion 203 beyond the drain region 702 is greater than the area of the first portion 201 beyond the channel region 703, it is able to further increase the heat dissipation rates of the source region 701 and the drain region 702 and make the heat dissipation rates of the source region 701 and the drain region 702 greater than the heat dissipation rate of the channel region 703. Thus the crystal nuclei will grow along the direction from the source region 701 and the drain region 702 toward the channel region 703, and form more uniform long crystal particles growing along the direction of the length of the channel region 703, such that the crystal particles of the channel region 703 have a greater size, better uniformity and higher crystal quality.

For example, the orthographic projection of the heat dissipation layer 20 on the substrate 10 completely covers the orthographic projection of the active layer 70 on the substrate 10. The heat dissipation layer 20 includes a first portion 201 corresponding to the channel region 703, a second portion 202 corresponding to the polar region 701, and a third portion 203 corresponding to the drain region 702. The areas of the second portion 202 and the third portion 203 are both greater than the area of the first portion 201.

In this way, it is ensured that the heat dissipation rates of the source region 701 and the drain region 702 are greater than the heat dissipation rate of the channel region 703. Thus the crystal nuclei will grow along the direction from the source region 701 and the drain region 702 toward the channel region 703, and form more uniform long crystal particles growing along the direction of the length of the channel region 703, such that the crystal particles of the channel region 703 have a greater size, better uniformity and higher crystal quality.

For example, after forming the heat dissipation layer 20 and before forming the amorphous silicon layer, the method further includes: forming the buffer layer 30.

The buffer layer 30 may be an one-layer structure. The material of the buffer layer 30 may be silicon oxide, silicon nitride, or the like. The buffer layer 30 may also have two or more layers.

In the embodiments of the present disclosure, it is able to prevent metal ion impurities of the substrate 10 and the heat dissipation layer 20 from diffusing into the active layer 70 and affecting the electrical characteristics of the TFT by providing the buffer layer 30 between the heat dissipation layer 20 and the active layer 70

Figure 6:
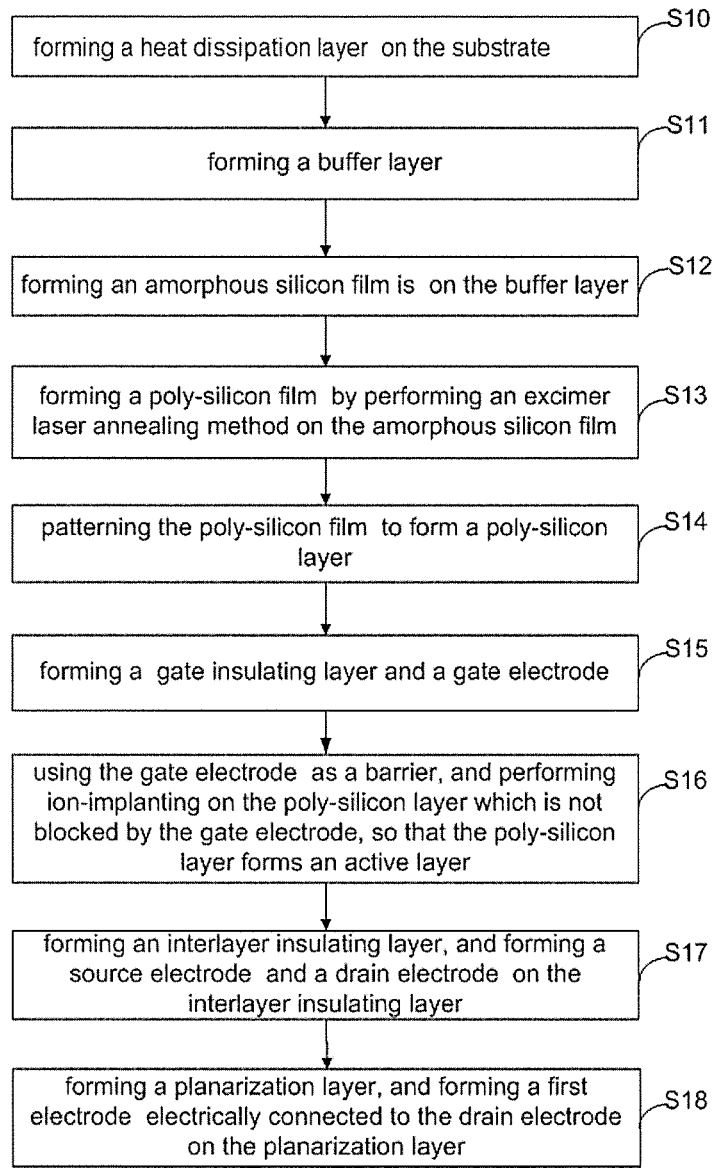
FIG. 6 is a flow diagram of a manufacturing method of an array substrate according to embodiments of the present disclosure.

A specific embodiment is provided below to describe the manufacturing method of an array substrate in detail. As shown in FIG. 6, the method includes the following steps.

Figure 7:
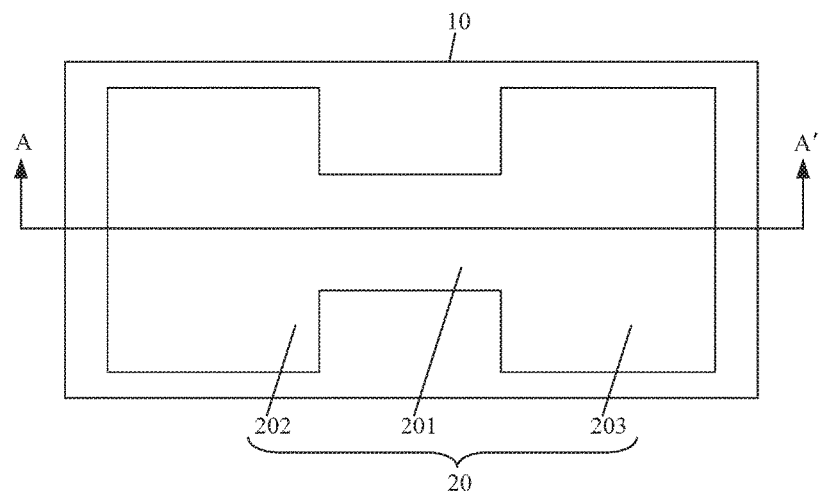
FIG. 7(a) is a top schematic view of forming a heat dissipation layer on a substrate according to embodiments of the present disclosure.
FIG. 7(b) is a cross-sectional view along the section line AA' of FIG. 7 (a)
Figure 7:
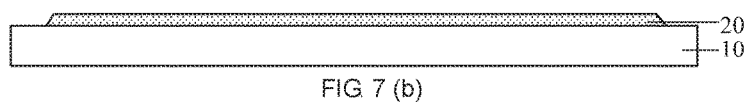

Step 10 (S10): forming a heat dissipation layer 20 on the substrate 10, as shown in FIG. 7(a) and FIG. 7(b).

For example, forming a metal film with a thickness of 40~200 nm on a pre-cleaned glass or other transparent substrate 10 by using magnetron sputtering method. The material of the metal film may be metal, metal alloy, etc., and the thermal conductivity of the metal film is greater than 85 W/(m·K). After that, the heat dissipation layer 20 is formed by a patterning process.

The orthographic projection of the heat dissipation layer 20 on the substrate 10 completely covers that of the active layer 70 to be formed on the substrate 10. The heat dissipation layer 20 includes a first portion 201 corresponding to the channel region 703 which is to be formed, a second portion 202 corresponding to the source region 701 which is to be formed, and a third portion 203 which corresponds to the drain region 702 which is to be formed.

The area of the second portion 202 beyond the source region 701 to be formed is greater than the area of the first portion 201 beyond the channel region 703 to be formed, and the area of the third portion 203 beyond the drain region 702 to be formed is greater than the area of the first portion 201 beyond the channel region to be formed. Alternatively, the areas of the second portion 202 and the third portion 203 are both greater than the area of the first portion 201.

Figure 8:
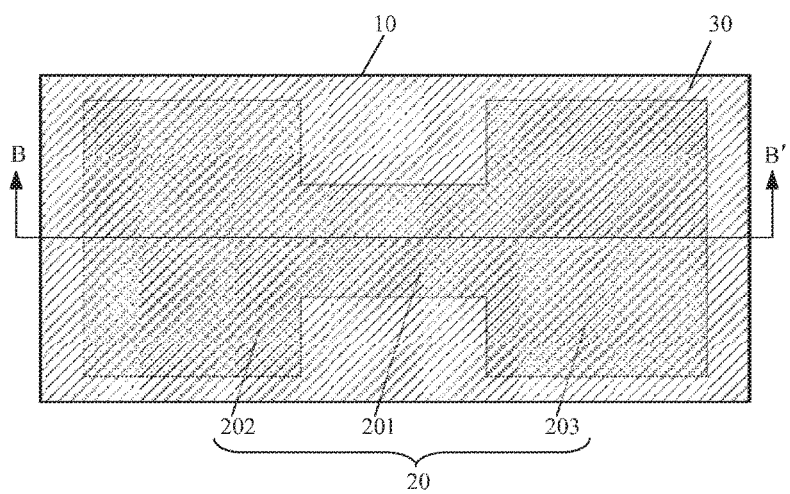
FIG. 8(a) is a top schematic view of forming a heat dissipation layer and a buffer layer on a substrate according to embodiments of the present disclosure.
FIG. 8(b) is a schematic cross-sectional view along the section line BB' of FIG. 8 (a)
FIG. 8(c) is a schematic diagram of forming an amorphous silicon thin film on the basis of FIG. 8 (b)
FIG. 8(d) is a schematic diagram of converting an amorphous silicon thin film into a poly-silicon thin film on the basis of FIG. 8 (c)
Figure 8:
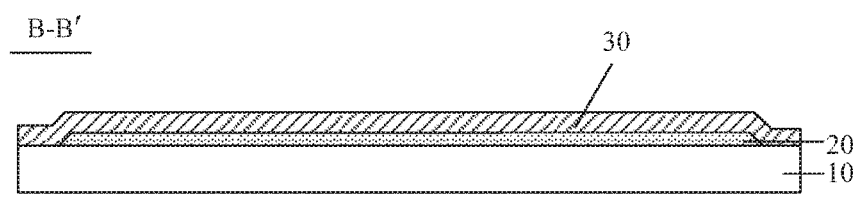
Figure 8:
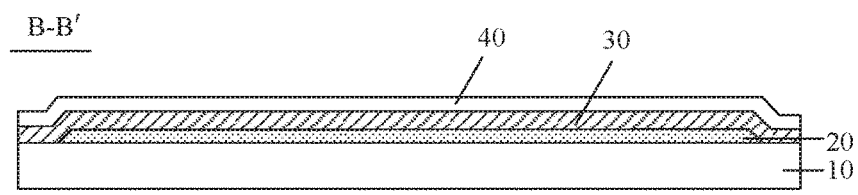
Figure 8:
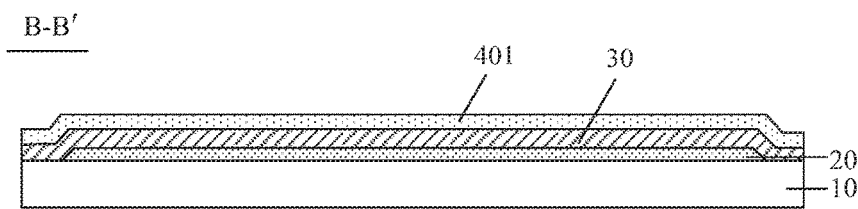

Step 11 (S11): forming the buffer layer 30 on the basis of the completion of the S10, as shown in FIG. 8 (a) and FIG. 8 (b).

For example, the buffer layer 30 can be formed, by using methods such as PECVD (Plasma Enhanced Chemical Vapor Deposition), LPCVD (Low Pressure Chemical Vapor Deposition), APCVD (Atmospheric Pressure Chemical Vapor Deposition), ECR-CVD (Electron Cyclotron Resonance Chemical Vapor Deposition) or sputtering.

The buffer layer 30 may be a single layer of silicon oxide, silicon nitride, or a lamination of the two. The thickness of the buffer layer 30 may be 50 nm~600 nm, for example, the thickness of the buffer layer 30 is 300 nm~500 nm.

Step 12 (S12): forming an amorphous silicon film 40 on the buffer layer 30 on the basis of completion of S11, as shown in FIG. 8 (c).

For example, the amorphous silicon film 40 can be formed by a method such as PECVD or LPCVD. The deposition temperature can be controlled below 600° C. The thickness of the amorphous silicon film 40 may be 10 nm~300 nm, for example, the thickness is 40 nm~100 nm.

Step 13 (S13): forming a poly-silicon film 401 by performing an excimer laser annealing method on the amorphous silicon film 40 on the basis of completion of S12, as shown in FIG. 8 (d).

A poly-silicon film 401 is formed by performing an excimer laser annealing method on the amorphous silicon film 40. For example, this step may be achieved by the following process: using an excimer laser irradiation process to make the temperature of the surface of the amorphous silicon thin film 40 is instantaneously brought to a high temperature of 1000° C. or higher in a period of about 50~150 ns and thus make the state of the amorphous silicon thin film 40 change to molten state, the amorphous silicon in the molten state is then annealed and crystallized to form the poly-silicon film 401.

Figure 9:
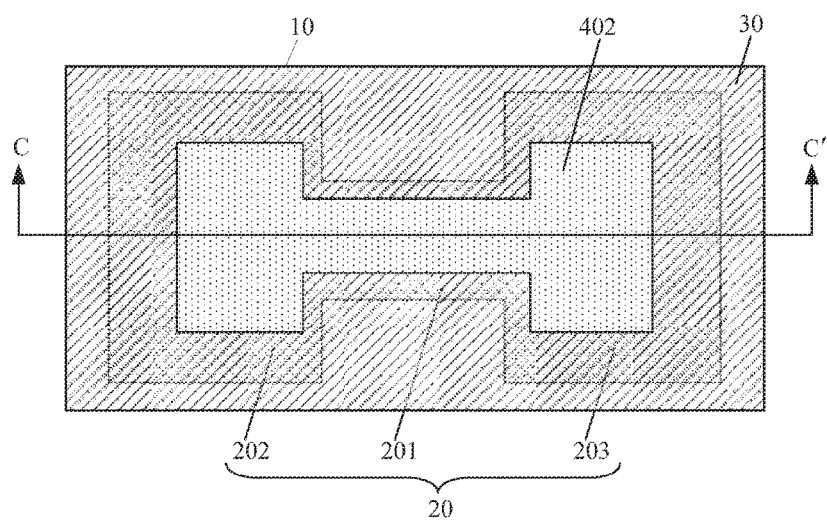
FIG. 9 (b) is a schematic cross-sectional view along the section line CC' of FIG. 9 (a)
Figure 9:
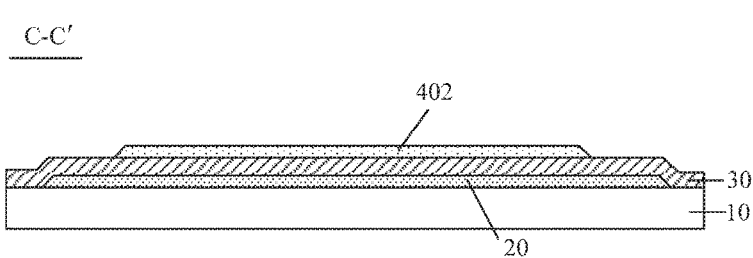

Step 14 (S14): patterning the poly-silicon film 401 to form the poly-silicon layer 402 as shown in FIG. 9 (a) and FIG. 9 (b), on the basis of the completion of S13.

For example, a photoresist film is formed on the poly-silicon film 401, and the substrate on which the photoresist film is formed is exposed by using a normal mask, the photoresist full retention portion and the photoresist full removal portion are formed after being developed. The photoresist full retention portion corresponds to the poly-silicon layer 402 and the photoresist full removal portion corresponds to other portions except the poly-silicon layer 402. The poly-silicon film 401 of the photoresist full removal portion is removed by using dry etching to form the poly-silicon layer 402. And the photoresist of the photoresist full retention portion is removed by using lift-off process.

Plasma etching, reactive ion etching, inductively coupled plasma etching or other methods may be selected and used in the dry etching method. The gas containing fluorine and chlorine, such as CF4 (tetrafluoromethane), CHF3 (trifluoromethane), SF6 (sulfur hexafluoride), CCl2F2 (difluorodichloromethane), etc., or a mixed gas of these gases and O2 (oxygen) can be selected as the etching gas.

It should be noted that, for the steps of S13 and S14, the amorphous silicon film 40 may be first patterned to form an amorphous silicon pattern at a position where the poly-silicon layer 402 is to be formed, and then the amorphous silicon pattern is processed by an excimer laser annealing method to form a poly-silicon layer 402.

Figure 10:
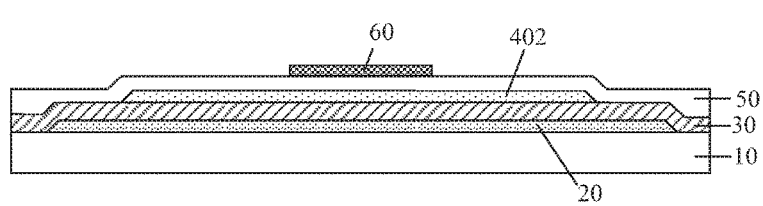
FIG. 10 is a schematic diagram of forming a gate electrode on the basis of FIG. 9 (b)

Step 15 (S15): forming the gate insulating layer 50 and the gate electrode 60 on the basis of the completion of S14, as shown in FIG. 10.

For example, the insulating film may be deposited by a method such as PECVD, LPCVD, APCVD or ECR-CVD to form the gate insulating layer 50. Then, a gate metal film is formed on the gate insulating layer 50 by a method of magnetron sputtering, thermal evaporation or PECVD, LPCVD, APCVD, ECR-CVD, etc., and the gate electrode 60 is formed by a patterning process.

The gate insulating layer 50 may be a single layer of silicon oxide, silicon nitride, or a lamination of the two. The thickness of the gate insulating layer 50 may be 50 nm~200 nm, for example, the thickness of the gate insulating layer 50 is 60 nm~150 nm.

The gate electrode 60 may be made of metal, metal alloy, for example, a conductive material such as molybdenum, aluminum, molybdenum, tungsten, etc. And the gate electrode 60 may have a one layer structure, a two layers structure, or a two or more layers structure. The thickness of the gate electrode 60 may be 100 nm~500 nm, preferably the thickness of the gate electrode 60 is 150 nm~400 nm.

Figure 11:
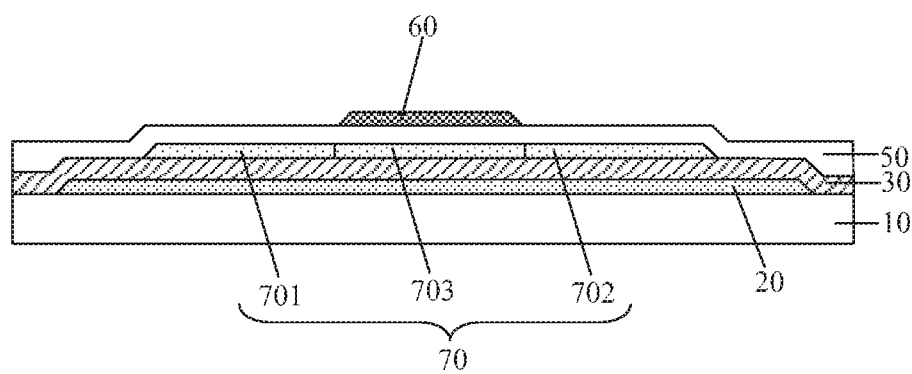
FIG. 11 is a schematic diagram of forming a poly-silicon layer as an active layer on the basis of FIG. 10.

Step 16 (S16): using the gate electrode 60 as a barrier, and performing ion-implanting on the poly-silicon layer 402 which is not blocked by the gate electrode, so that the poly-silicon layer 402 forms into the active layer 70 as shown in FIG. 11, on the basis of the completion of S15.

The active layer 70 includes the source region 701, the drain region 702 and the channel region 703 disposed between the source region 701 and the drain region 702.

For example, ion-implantation may be performed by the method of ion-implantation with a mass analyzer, ion cloud implantation without a mass analyzer, plasma implantation, or solid-state diffusion implantation or other methods. For example, an ion cloud implantation method may be adopted, and a mixed gas containing boron such as $B_2H_6/H_2$, or phosphorus such as $PH_3/H_2$ may be adopted to be ion-implanted according to design requirements. The energy of the ion-implantation may be 10~200 keV, preferably the energy of the ion-implantation is 40~100 keV and the implantation dose may be in a range of $1\times10^{11}$~$1\times10^{20}$ atoms/cm$^3$, for example, the implantation dose is $1\times10^{14}$~$1\times10^{18}$ atoms/cm$^3$.

In addition, an activation may be performed by a method of rapid thermal annealing, laser annealing or furnace annealing after the ion implantation. The method of furnace annealing is relatively more economical, simpler and better annealing uniformity. In the embodiments of the present disclosure, it is preferable to use an activation heat treatment in an annealing furnace at 300~600° C. for 0.5~4 hours (preferably 1~3 hours).

In the embodiments of the present disclosure, the N-type or P-type source region 701 and the drain region 702 are formed by performing the ion-implantation on the poly-silicon layer 402 which is not blocked by the gate electrode 60. The ion-implantation dose is between $1\times10^{11}$ and $1\times10^{20}$ atoms/cm$^3$, which ensures that ions can penetrate the buffer layer 30 to be applied to the source region 701 and the drain region 702.

Step 17 (S17): forming the interlayer insulating layer 80, and forming the source electrode 901 and the drain electrode 902 on the interlayer insulating layer 80 on the basis of the completion of S16, as shown in FIG. 2.

The source electrode 901 and the drain electrode 902 are in contact with the source region 701 and the drain region 702 through via hole formed in the interlayer insulating layer 80 and the gate insulating layer 50, respectively.

For example, the interlayer insulating layer 80 may be deposited by a method such as PECVD, LPCVD, APCVD or ECR-CVD at a temperature of under 600° C. Then, a source/drain metal film is formed on the gate insulating layer by sputtering, thermal evaporation or PECVD, LPCVD, APCVD, ECR-CVD or the other methods, and the source electrode 901 and the drain electrode 902 are formed by the patterning process.

The interlayer insulating layer 80 may be a single layer of silicon oxide or a lamination of silicon oxide and silicon nitride. The thickness of the interlayer insulating layer 80 may be 300 nm~900 nm, for example, the thickness of the interlayer insulating layer 80 is 400 nm~600 nm.

When forming the via hole on the interlayer insulating layer 80 and the gate insulating layer 50, dry etching may be adopted, that is, plasma etching, reactive ion etching, inductively coupled plasma etching or other methods may be selected and used. And the gas containing fluorine and chlorine, such as CF4, CHF3, SF6, CCl2F2, etc. or a mixture of these gases and O2 gas can be selected as the etching gas.

The source electrode 901 and the drain electrode 902 may be made of metal, metal alloy, for example, a conductive material such as molybdenum, molybdenum alloy, aluminum, aluminum alloy, titanium, etc. The thickness of the source electrode 901 and the drain electrode 902 may be 100 nm~800 nm, preferably the thickness of the source electrode 901 and the drain electrode 902 are 250 nm~400 nm.

A low temperature poly-silicon thin film transistor of high quality can be prepared through the above steps S10~S17.

Step 18 (S18): forming a planarization layer 100, and forming the first electrode 110 electrically connected to the drain electrode 902 on the planarization layer 100 on the basis of the completion of S17, as shown in FIG. 4 and FIG. 5. The first electrode 110 is a pixel electrode or an anode.

The material of the planarization layer 100 may be, for example, a photosensitive or non-photosensitive resin material, and the thickness of the planarization layer 100 may be 1.5 µm~5 µm.

The material of the first electrode 110 may be indium tin oxide (ITO), and the thickness of the first electrode 110 may be 400 Å~700 Å.

If the first electrode 110 is an anode, the array substrate is an OLED array substrate, and the array substrate further includes an organic material functional layer 111 and a cathode 112 as shown in FIG. 5.

If the first electrode 110 is a pixel electrode, the array substrate is an LCD array substrate, and the array substrate may further includes a common electrode.

The above descriptions are merely exemplary embodiments of the present disclosure, not intended to limit the protection scope of the present disclosure. The protection scope of the disclosure is determined by the appended claims.

What is claimed is:

1. An array substrate, comprising:
   a substrate;
   a thin film transistor on the substrate, and comprising an active layer comprising a source region, a drain region, and a channel region between the source region and the drain region; and
   a heat dissipation layer between the substrate and the active layer;
   wherein
   an orthographic projection of the heat dissipation layer on the substrate at least covers the orthographic projection of a part of the source region and a part of the drain region on the substrate, the heat dissipation layer is configured to make heat dissipation rates of the source region and the drain region larger than a heat dissipation rate of the channel region.

2. The array substrate according to claim 1, wherein the orthogonal projection of the heat dissipation layer on the substrate completely covers the orthogonal projection of the channel region.

3. The array substrate according to claim 1, wherein the heat dissipation layer is a metal light-shielding layer.

4. The array substrate according to claim 1, wherein the orthogonal projection of the heat dissipation layer on the substrate completely covers the orthogonal projection of the active layer on the substrate.

5. The array substrate according to claim 4, wherein the heat dissipation layer comprises a first portion corresponding to the channel region, a second portion corresponding to the source region, and a third portion corresponding to the drain region;
   the size of the second portion beyond the source region is greater than the size of the first portion beyond the channel region, and the size of the third portion beyond the drain region is greater than the size of the first portion beyond the channel region, along the direction perpendicular to the length of the channel region.

6. The array substrate according to claim 5, wherein the second portion extends beyond the source region and the third portion extends beyond the drain region along the direction of the length of the channel region.

7. The array substrate according to claim 5, wherein the orthographic projection of the first portion on the substrate is larger than the orthographic projection of the channel region on the substrate, the orthographic projection of the second portion on the substrate is larger than the orthographic projection of the source region on the substrate, and the orthographic projection of the third portion on the substrate is larger than the orthographic projection of the drain region on the substrate.

8. The array substrate according to claim 4, wherein the heat dissipation layer comprises a first portion corresponding to the channel region, a second portion corresponding to the source region, and a third portion corresponding to the drain region;
   the area of the second portion beyond the source region is greater than the area of the first portion beyond the channel region; the area of the third portion beyond the drain region is greater than the area of the first portion beyond the channel region.

9. The array substrate according to claim 1, wherein the heat dissipation layer comprises a first portion corresponding to the channel region, a second portion corresponding to the source region, and a third portion corresponding to the drain region;

areas of the second portion and the third portion are both greater than the area of the first portion.

10. The array substrate according to claim 1, wherein a thermal conductivity of the heat dissipation layer is greater than 85 W/(m·K).

11. The array substrate according to claim 1, wherein a thickness of the heat dissipation layer is 40~200 nm.

12. The array substrate according to claim 1, further comprising a buffer layer disposed between the heat dissipation layer and the active layer.

13. A display device, comprising the array substrate according to claim 1.

14. A manufacturing method of an array substrate, comprising:

forming a heat dissipation layer on a substrate;

forming an amorphous silicon layer on the heat dissipation layer;

processing the amorphous silicon layer to form an active layer comprising a source region, a drain region, and a channel region between the source region and the drain region, wherein the orthographic projection of the heat dissipation layer on the substrate at least covers the orthographic projection of a part of the source region and a part of the drain region on the substrate, the heat dissipation layer is configured to make heat dissipation rates of the source region and the drain region larger than a heat dissipation rate of the channel region.

15. The manufacturing method according to claim 14, wherein processing the amorphous silicon layer to form an active layer comprising a source region, a drain region, and a channel region between the source region and the drain region, comprising:

annealing the amorphous silicon layer to form a poly-silicon layer;

patterning the poly-silicon layer to form the active layer comprising the source region, the drain region, and the channel region between the source region and the drain region.

16. The manufacturing method according to claim 14, wherein the heat dissipation layer is a metal light-shielding layer.

17. The manufacturing method according to claim 14, wherein the orthogonal projection of the heat dissipation layer on the substrate completely covers the orthogonal projection of the active layer on the substrate.

18. The manufacturing method according to claim 17, wherein the heat dissipation layer comprises a first portion corresponding to the channel region, a second portion corresponding to the source region, and a third portion corresponding to the drain region;

the size of the second portion beyond the source region is greater than the size of the first portion beyond the channel region, and the size of the third portion extends beyond the drain region is greater than the size of the first portion beyond the channel region, along the direction perpendicular to the length of the channel region.

19. The manufacturing method according to claim 14, further comprising:

forming a gate insulating layer and a gate electrode on the active layer sequentially;

using the gate electrode as a mask, and performing ion-implanting on the active layer that is not blocked by the gate electrode;

forming an interlayer insulating layer, a source electrode and a drain electrode, and the source electrode and the drain electrode are in contact with the active layer.

20. The manufacturing method according to claim 14, further comprising: forming a buffer layer on the heat dissipation layer before forming the amorphous silicon layer.

* * * * *